US008417203B2

United States Patent
Saito

(10) Patent No.: US 8,417,203 B2
(45) Date of Patent: Apr. 9, 2013

(54) RECEIVER AND GAIN CONTROL METHOD

(75) Inventor: Noriaki Saito, Tokyo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/810,211

(22) PCT Filed: Dec. 16, 2008

(86) PCT No.: PCT/JP2008/003794
§ 371 (c)(1),
(2), (4) Date: Jun. 23, 2010

(87) PCT Pub. No.: WO2009/081541
PCT Pub. Date: Jul. 2, 2009

(65) Prior Publication Data
US 2010/0267351 A1   Oct. 21, 2010

(30) Foreign Application Priority Data

Dec. 26, 2007 (JP) .................................. 2007-334609

(51) Int. Cl.
*H04B 1/06* (2006.01)
(52) U.S. Cl.
USPC ..................................... 455/234.1; 455/242.2
(58) Field of Classification Search ...... 455/234.1–253.2
See application file for complete search history.

(56) References Cited

U.S. PATENT DOCUMENTS

| 6,420,934 | B1 * | 7/2002 | Butler et al. | 330/279 |
| 6,438,184 | B1 * | 8/2002 | Nayler | 375/345 |
| 6,804,501 | B1 * | 10/2004 | Bradley et al. | 455/138 |
| 7,353,010 | B1 * | 4/2008 | Zhang et al. | 455/234.1 |
| 7,890,075 | B2 * | 2/2011 | Xin et al. | 455/247.1 |

FOREIGN PATENT DOCUMENTS

| JP | 2000-286908 A | 10/2000 |
| JP | 2005-323123 A | 11/2005 |
| JP | 2006-319637 A | 11/2006 |
| JP | 2007-067583 A | 3/2007 |
| JP | 2007-124403 A | 5/2007 |

OTHER PUBLICATIONS

International Search Report for PCT/JP2008/003794, Feb. 2009.

* cited by examiner

*Primary Examiner* — Lana N Le
(74) *Attorney, Agent, or Firm* — Pearne & Gordon LLP

(57) ABSTRACT

A receiver capable of performing optimum automatic gain control responsive to a peak factor of an input signal before subjected to A/D conversion is provided in a simple configuration. A peak detector 104 is placed at the later stage of a variable gain amplifier 102, two power determiners 107 and 108 different in threshold value are used, and the amplitude density is determined in three areas separated by two threshold values PDETL and PDETH, whereby it is made possible to identify the input signal having a peak factor different in modulation system and perform optimum gain control without A/D conversion of the input signal.

6 Claims, 7 Drawing Sheets

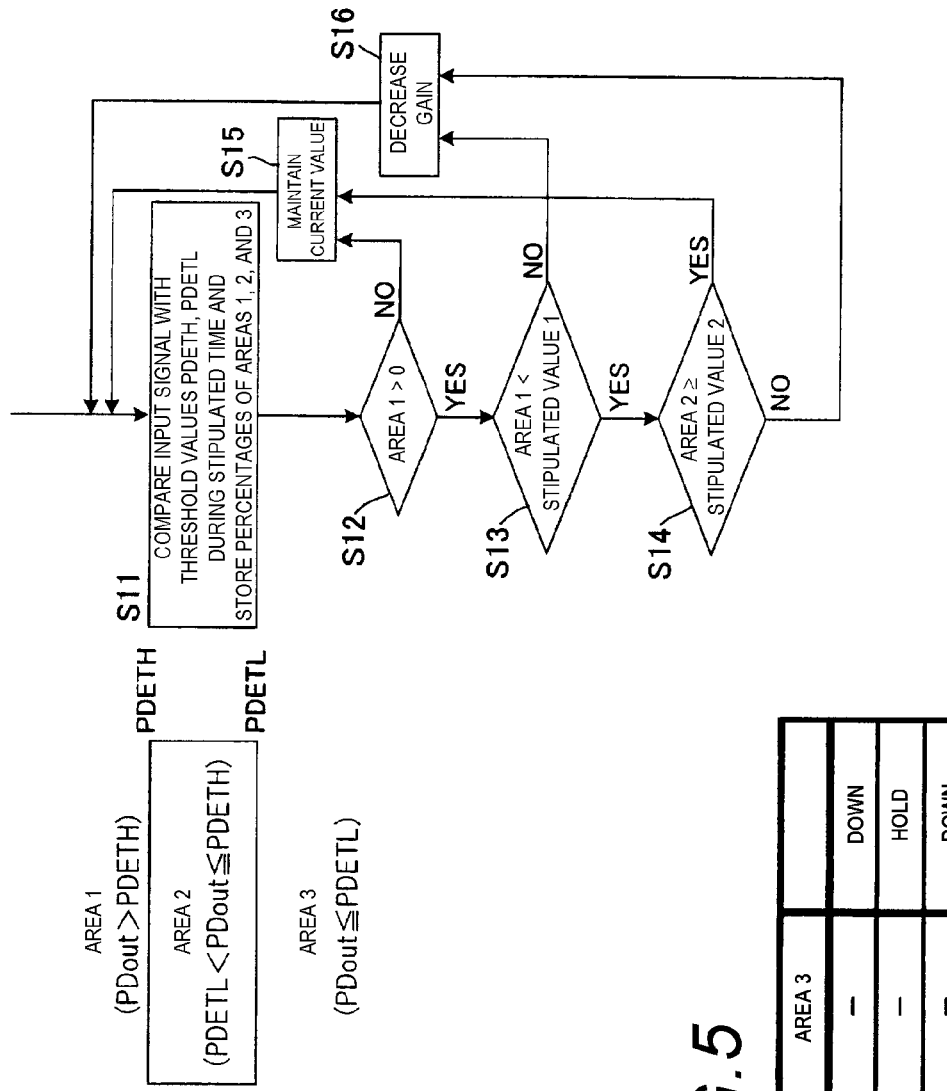

FIG.6

| DETECTION RANGE [dB] | STRENGTH [dB] | FOMA (%) AREA 1 | FOMA (%) AREA 2 | FOMA (%) AREA 3 | GAIN CONTROL | DTV (%) AREA 1 | DTV (%) AREA 2 | DTV (%) AREA 3 | GAIN CONTROL | DETERMINATION |
|---|---|---|---|---|---|---|---|---|---|---|
| 1 | 0 | 0.0 | 2.4 | 97.6 | Down | 0.0 | 0.0 | 99.9 | Down | × NO DIFFERENCE |
| 1 | 1 | 2.4 | 18.7 | 78.9 | Down | 0.1 | 0.4 | 99.6 | Down | |
| 1 | 2 | 21.1 | 25.5 | 53.3 | Down | 0.4 | 1.0 | 98.5 | Down | |
| 1 | 3 | 46.7 | 22.9 | 30.4 | Down | 1.5 | 2.6 | 95.9 | Down | |
| 1 | 4 | 69.6 | 12.8 | 17.6 | Down | 4.1 | 5.6 | 90.3 | Down | |
| 2 | 0 | 0.0 | 21.1 | 78.9 | HOLD | 0.0 | 0.4 | 99.6 | Down | ○ 2 dB DIFFERENCE OPERABLE AREA |
| 2 | 1 | 2.4 | 44.2 | 53.3 | HOLD | 0.1 | 1.4 | 98.5 | Down | |
| 2 | 2 | 21.1 | 48.5 | 30.4 | Down | 0.4 | 3.6 | 95.9 | Down | |
| 2 | 3 | 46.7 | 35.7 | 17.6 | Down | 1.5 | 8.2 | 90.3 | Down | |
| 2 | 4 | 69.6 | 21.2 | 9.2 | Down | 4.1 | 15.7 | 80.2 | Down | |
| 3 | 0 | 0.0 | 46.7 | 53.3 | HOLD | 0.0 | 1.5 | 98.5 | Down | |
| 3 | 1 | 2.4 | 67.2 | 30.4 | HOLD | 0.1 | 4.0 | 95.9 | Down | |
| 3 | 2 | 21.1 | 61.3 | 17.6 | Down | 0.4 | 9.3 | 90.3 | Down | |
| 3 | 3 | 46.7 | 44.2 | 9.2 | Down | 1.5 | 18.3 | 80.2 | Down | |
| 3 | 4 | 69.6 | 25.2 | 5.2 | Down | 4.1 | 30.0 | 65.9 | Down | |
| 4 | 0 | 0.0 | 69.6 | 30.4 | HOLD | 0.0 | 4.1 | 95.9 | Down | |
| 4 | 1 | 2.4 | 80.0 | 17.6 | HOLD | 0.1 | 9.7 | 90.3 | Down | |
| 4 | 2 | 21.1 | 69.7 | 9.2 | Down | 0.4 | 19.3 | 80.2 | Down | |
| 4 | 3 | 46.7 | 48.1 | 5.2 | Down | 1.5 | 32.6 | 65.9 | Down | |
| 4 | 4 | 69.6 | 28.0 | 2.4 | Down | 4.1 | 48.5 | 47.4 | Down | |
| 5 | 0 | 0.0 | 82.4 | 17.6 | HOLD | 0.0 | 9.7 | 90.3 | Down | × ERRONEOUS DETERMINATION OF DTV SIGNAL IN 3 dB UP |
| 5 | 1 | 2.4 | 88.4 | 9.2 | HOLD | 0.1 | 19.7 | 80.2 | Down | |
| 5 | 2 | 21.1 | 73.7 | 5.2 | Down | 0.4 | 33.6 | 65.9 | Down | |
| 5 | 3 | 46.7 | 50.9 | 2.4 | Down | *1.5* | *51.1* | *47.4* | *HOLD* | |
| 5 | 4 | 69.6 | 29.3 | 1.1 | Down | 4.1 | 70.9 | 25.1 | Down | |

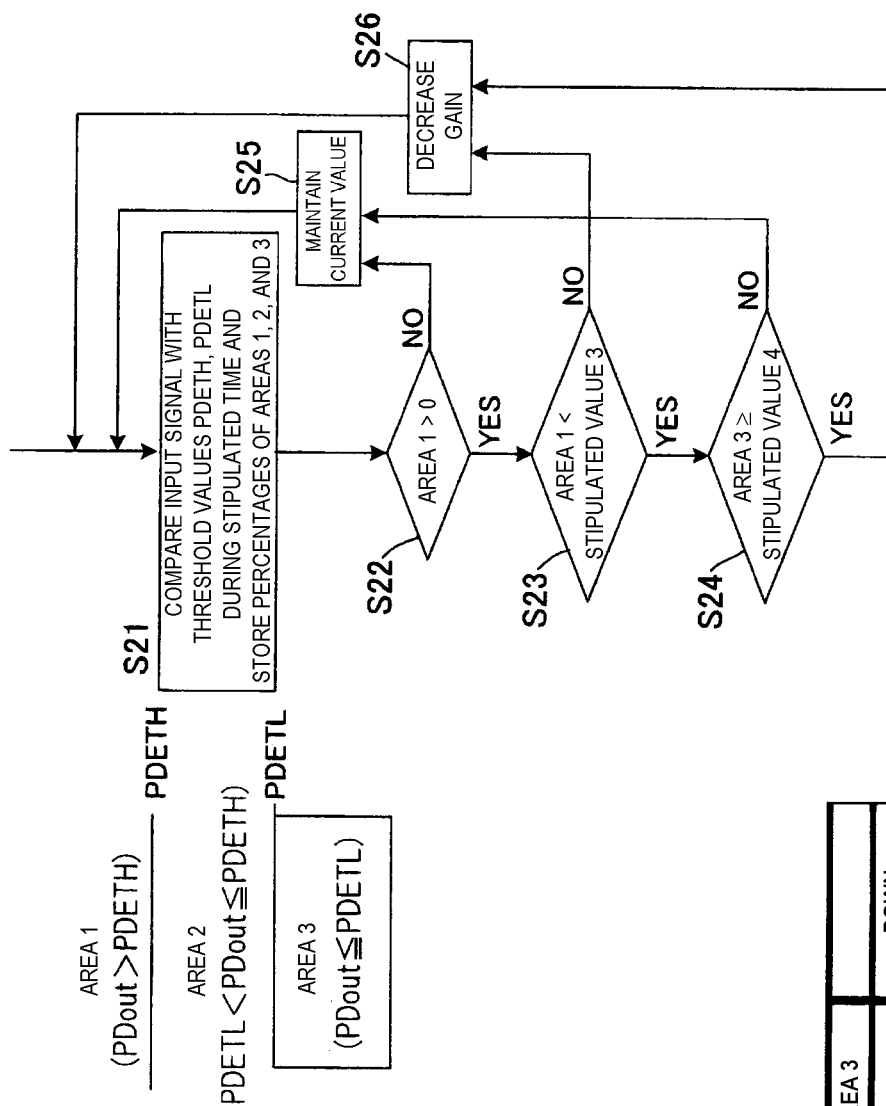

RECEIVER AND GAIN CONTROL METHOD

TECHNICAL FIELD

This invention relates to a receiver and a gain control method having an automatic gain control function.

BACKGROUND ART

A mobile communication receiver generally has an automatic gain control function of increasing or decreasing the gain of an amplifier in response to the average power level of a reception signal and keeping the input level to a demodulator constant. However, a reception signal containing an interfering wave contains a plurality of modulation signals and the ratio between the maximum peak power and the average peak power, namely, the peak factor varies according to each modulation system. Thus, it cannot be said that sufficient gain control can be performed simply by controlling the gain of the amplifier in response to the average power level of the reception signal. Then, for example, Patent Document 1 describes an art of performing optimum gain control considering not only the average power of the reception signal, but also the peak factor of the modulation signal contained in the reception signal.

FIG. 9 shows the configuration of a receiver having the automatic gain control function described in Patent Document 1. In FIG. 9, a receiver 1 amplifies a received input signal to a predetermined level by a signal amplification section 2. Output of the signal amplification section 2 is converted into a digital signal by an A/D converter 4 in a signal demodulation section 3 and the digital signal is output to a peak power calculator 5 and a channel demodulator 6.

The peak power calculator 5 calculates peak power. A channel average power calculator 7 calculates average power from output of the channel demodulator 6. The peak power calculated by the peak power calculator 5 is compared with a threshold value 9 by a power determiner 8. The average power calculated by the channel average power calculator 7 is compared with a threshold value 11 by a power determiner 10. The gain of a variable gain device 12 is increased or decreased in response to the determination result of the peak power and the average power, whereby the automatic gain control function responsive to the peak factor of the input signal is realized.

Patent Document 2 discloses a wireless reception device for determining the modulation system of a signal from header information of a reception signal and performing automatic gain control in response to the modulation system, thereby realizing an automatic gain control function responsive to the peak factor of a reception signal.

Patent Document 1: JP-A-2005-323123 (first page, FIG. 1)
Patent Document 2: JP-A-2007-124403 (third page)

DISCLOSURE OF THE INVENTION

Problems to be Solved by the Invention

In the receiver described in Patent Document 1, the peak power and the average power of the reception signal are calculated as digital processing after passage of the A/D converter 4. However, the dynamic range and the frequency range of the A/D converter 4 are finite and thus usually narrow-band filtering processing becomes necessary just before the A/D converter 4 although not described in Patent Document 1.

At this time, if a strong input interfering wave is input to the signal amplification section 2, the level of the filtered strong input interfering wave cannot be detected after the A/D converter 4 and a command to lower the gain of the signal amplification section 2 cannot be issued. Thus, the possibility that the signal amplification section 2 may produce nonlinear distortion because of the strong input interfering wave is high.

In the wireless reception device described in Patent Document 2, actually the reception signal is demodulated and header information added to the demodulated signal is read, whereby the type of modulation wave (modulation system) is identified and thus if a modulation wave of a different system not supported by the reception device is input as an interfering wave, it cannot be handled.

Further, if the receiver is a mobile telephone with a terrestrial digital TV tuner or a mobile terminal with a terrestrial digital TV tuner, the following disadvantage occurs: Specifically, while TV is being viewed, namely, if the gain of an amplifier corresponds to the terrestrial digital TV broadcast wave, when transmission of a FOMA (registered trademark) modulation wave is started for telephone call, the modulation wave having higher average power level than the terrestrial digital TV broadcast wave being received leaks to an input terminal of the terrestrial digital TV tuner. Then, the gain of the amplifier is set to that corresponding to the modulation wave having higher average power level than the terrestrial digital TV broadcast wave and may become insufficient as the gain for the terrestrial digital TV broadcast wave.

It is an object of the invention to provide a receiver and a gain control method capable of performing optimum automatic gain control responsive to a peak factor of an input signal before subjected to A/D conversion.

Means for Solving the Problems

The invention provides a receiver comprising: a variable gain amplifier for amplifying an input signal in a set gain; a peak detector for detecting instantaneous peak power PDout of output of the variable gain amplifier; a first power determiner for comparing the instantaneous peak power PDout with a threshold value PDETL; a second power determiner for comparing the instantaneous peak power PDout with a threshold value PDETH larger than the threshold value PDETL; and an amplitude density calculator for controlling a value of the gain of the variable gain amplifier based on amplitude density determined from output results of the first power determiner and the second power determiner.

According to the configuration described above, the peak detector is placed at the later stage of the variable gain amplifier and two power determiners different in threshold value are used, whereby two types of modulation waves different in peak factor can be distinguished without A/D conversion of an input signal, so that optimum automatic gain control responsive to the peak factor of the input signal can be performed in the simple configuration. Therefore, it is made possible to perform appropriate gain control considering the level of a strong input interfering wave existing outside of the filter band of a narrow-band filter provided at the preceding stage of an A/D converter. The case where a modulation wave of a different system not supported by the receiver is input as an interfering wave can also be handled.

The receiver according to the invention may be configured in that a level difference between the threshold values PDETH and PDETL is set to a value close to a peak factor value of a modulation wave with a small peak factor, of two types of modulation waves to be distinguished.

According to the configuration described above, information of the amplitude density of the input signal determined is used and the gain of the variable gain amplifier is set to the optimum value responsive to the peak factor and automatic gain control not depending on the input dynamic range of the A/D converter can be realized in the simple configuration.

The receiver according to the invention may be configured in that the amplitude density calculator controls the gain of the variable gain amplifier based on which of a first power area larger than the threshold value PDETH, a second power area equal to or less than the threshold value PDETH and larger than the threshold value PDETL, and a third power area equal to or less than the threshold value PDETL the instantaneous peak power PDout corresponds to.

According to the configuration described above, the instantaneous peak power PDout output from the peak detector is compared with the two threshold values PDETH and PDETL and it is made possible to identify the type of input signal having a different peak factor based on the percentage in which the instantaneous peak power PDout exists in each power area and execute optimum gain control.

The receiver according to the invention may be configured in that the amplitude density calculator controls the gain of the variable gain amplifier based on a percentage in which the instantaneous peak power PDout corresponds to the second power area in a given time period.

According to the configuration described above, the instantaneous peak power PDout output from the peak detector is compared with the two threshold values PDETH and PDETL and it is made possible to identify the type of input signal having a different peak factor based on the percentage in which the instantaneous peak power PDout exists in the second power area and execute optimum gain control.

The receiver according to the invention may be configured in that the amplitude density calculator controls the gain of the variable gain amplifier based on a percentage in which the instantaneous peak power PDout corresponds to the third power area in a given time period.

According to the configuration described above, the instantaneous peak power PDout output from the peak detector is compared with the two threshold values PDETH and PDETL and it is made possible to identify the type of input signal having a different peak factor based on the percentage in which the instantaneous peak power PDout exists in the third power area and execute optimum gain control.

A wireless device according to the invention installs the receiver as in the invention.

According to the configuration described above, two types of modulation waves different in peak factor can be distinguished without A/D conversion of an input signal, so that the wireless device that can perform optimum automatic gain control responsive to the peak factor of the input signal can be realized in the simple configuration.

A gain control method according to the invention is a gain control method for a variable gain amplifier for amplifying an input signal, the gain control method comprising the steps of; setting a first power area larger than a threshold value PDETH, a second power area equal to or less than the threshold value PDETH and larger than a threshold value PDETL, and a third power area equal to or less than the threshold value PDETL; detecting instantaneous peak power PDout of output of the variable gain amplifier; maintaining the gain of the variable gain amplifier in the current gain if the percentage in which the instantaneous peak power PDout corresponds to the first power area is zero; decreasing the gain of the variable gain amplifier if the percentage in which the instantaneous peak power PDout corresponds to the first power area is not zero and is equal to or larger than a first stimulated value; maintaining the gain of the variable gain amplifier in the current gain if the percentage in which the instantaneous peak power PDout corresponds to the first power area is not zero and is smaller than the first stimulated value and the percentage in which the instantaneous peak power PDout corresponds to the second power area is equal to or larger than a second stipulated value; and decreasing the gain of the variable gain amplifier if the percentage in which the instantaneous peak power PDout corresponds to the first power area is not zero and is smaller than the first stimulated value and the percentage in which the instantaneous peak power PDout corresponds to the second power area is smaller than the second stipulated value.

According to the configuration described above, information of the amplitude density of the input signal is used and the gain of the variable gain amplifier is set to the optimum value and automatic gain control not depending on the input dynamic range of the A/D converter can be realized in the simple configuration.

A gain control method according to the invention is a gain control method for a variable gain amplifier for amplifying an input signal, the gain control method comprising the steps of; setting a first power area larger than a threshold value PDETH, a second power area equal to or less than the threshold value PDETH and larger than a threshold value PDETL, and a third power area equal to or less than the threshold value PDETL, detecting instantaneous peak power PDout of output of the variable gain amplifier; maintaining the gain of the variable gain amplifier in the current gain if the percentage in which the instantaneous peak power PDout corresponds to the first power area is zero; decreasing the gain of the variable gain amplifier if the percentage in which the instantaneous peak power PDout corresponds to the first power area is not zero and is equal to or larger than a third stimulated value; maintaining the gain of the variable gain amplifier in the current gain if the percentage in which the instantaneous peak power PDout corresponds to the first power area is not zero and is smaller than the third stimulated value and the percentage in which the instantaneous peak power PDout corresponds to the third power area is smaller than a fourth stipulated value; and decreasing the gain of the variable gain amplifier if the percentage in which the instantaneous peak power PDout corresponds to the first power area is not zero and is smaller than the third stimulated value and the percentage in which the instantaneous peak power PDout corresponds to the third power area is equal to or larger than the fourth stipulated value.

According to the configuration described above, information of the amplitude density of the input signal is used and the gain of the variable gain amplifier is set to the optimum value and optimum automatic gain control responsive to the peak factor of the input signal can be performed.

Advantages of the Invention

According to the receiver and the gain control method according to the invention, information of the amplitude density of the input signal is used and the gain of the variable gain amplifier is set to the optimum value and optimum automatic gain control responsive to the peak factor of the input signal can be performed.

BRIEF DESCRIPTION OF THE DRAWINGS

FIG. 4 is a flowchart of gain control of a receiver in Embodiment 2 of the invention.

FIG. 5 shows gain control determination criteria in Embodiment 2 of the invention.

FIG. 6 shows the gain control result in Embodiment 2 of the invention.

FIG. 7 is a flowchart of gain control of a receiver in Embodiment 3 of the invention.

FIG. 8 shows gain control determination criteria in Embodiment 3 of the invention.

Figure 1:
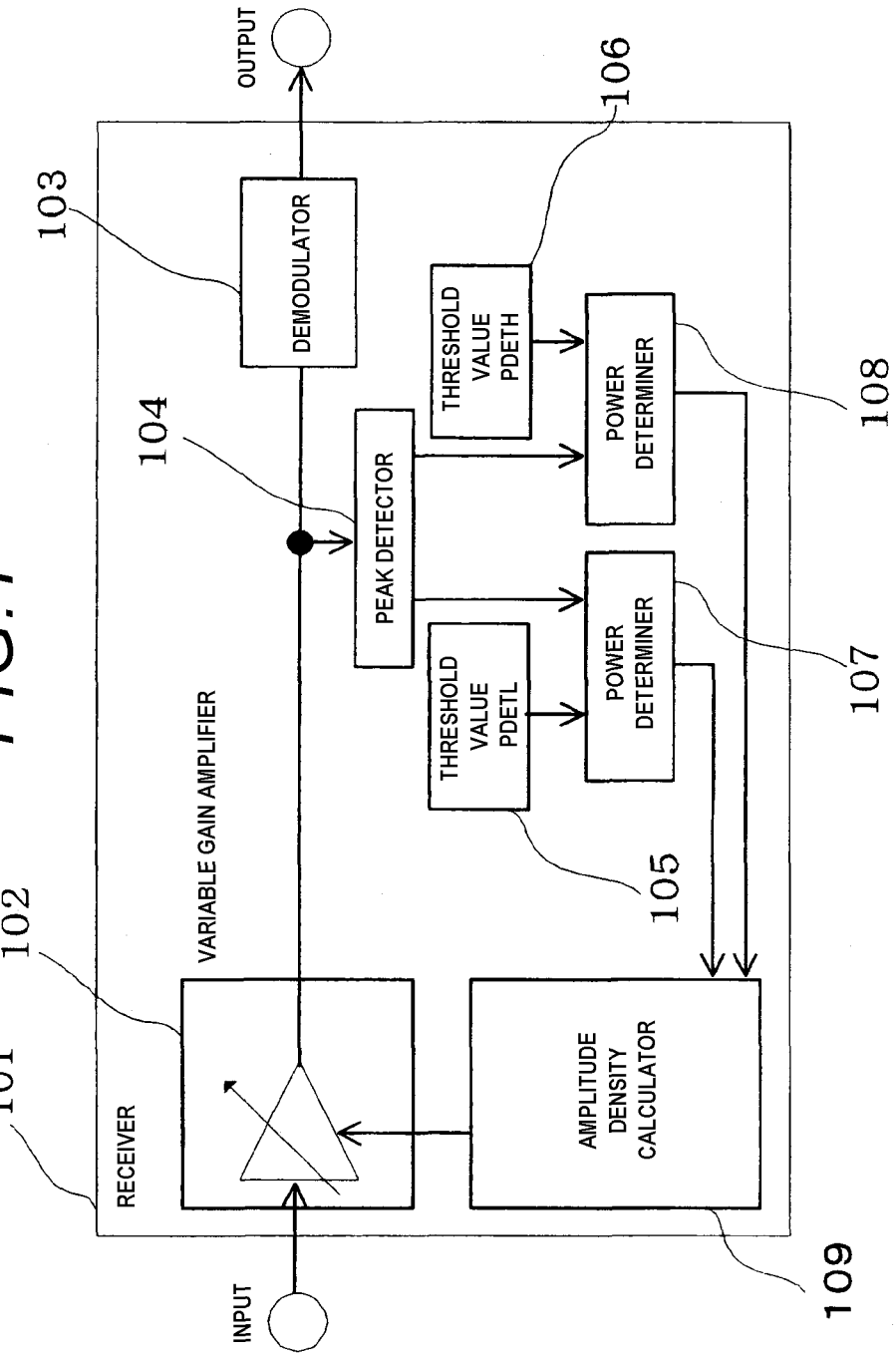
FIG. 1 shows the configuration of a receiver in Embodiment 1 of the invention.

DESCRIPTION OF REFERENCE NUMERALS AND SIGNS 1, 101 Receiver
2 Signal amplification section
3 Signal demodulation section
4 A/D converter
5 Peak power calculator
6 Channel demodulator
7 Channel average power calculator
8, 10, 107, 108 Power determiner
9, 11 Threshold value
12 Variable gain device
102 Variable gain amplifier
103 Demodulator
104 Peak detector
105 Threshold value PDETL
106 Threshold value PDETH
109 Amplitude density calculator

BEST MODE FOR CARRYING OUT THE INVENTION

Embodiments of the invention will be described below with reference to the accompanying drawings: Identical parts in the drawings are denoted by the same reference numerals and will be described.

Embodiment 1

FIG. 1 shows the configuration of a receiver in Embodiment 1 of the invention. As shown in FIG. 1, a receiver 101 includes a variable gain amplifier 102 for amplifying an input signal in a gain set by an amplitude density calculator 109 described later, a demodulator 103 for performing quadrature demodulation of output of the variable gain amplifier 102 and outputting the result, a peak detector 104 for detecting instantaneous peak power of output of the variable gain amplifier 102, power determiners 107 and 108 for comparing output of the peak detector 104 with threshold values PDETL 105 and PDETH 106 respectively, and the amplitude density calculator 109 for determining the amplitude density, namely, the percentage of input signals with the peak existing in a specific power area, of the input signals input within a given time period from the output result of the power determiner 107, 108 and controlling the gain of the variable gain amplifier 102 based on the determination result.

The operation of the described receiver 101 is as follows: A reception signal applied from input is given to the variable gain amplifier 102 and is amplified in the gain set by the amplitude density calculator 109 at the point in time.

The signal amplified by the variable gain amplifier 102 is input to the peak detector 104 and the demodulator 103. The peak detector 104 outputs the signal amplitude value of each peak of the input signal to the power determiners 107 and 108.

The signal amplitude value of each peak output from the peak detector 104 is compared with the threshold value PDETL by the power determiner 107 and is compared with the threshold value PDETH by the power determiner 108. The comparison results (determination results) are sent to the amplitude density calculator 109. Here, it is assumed that the threshold value PDETH is larger than the threshold value PDETL.

The amplitude density calculator 109 determines the amplitude density of the input signal based on the determination results of the power determiners 107 and 108, namely, larger-than, smaller-than information of the threshold values PDETL and PDETH and the signal amplitude value. The amplitude density indicates the percentage (%) in which the signal peak is positioned in area 1 (larger than PDETH), the percentage (%) in which the signal peak is positioned in area 2 (larger than PDETL and equal to or less than PDETH), the percentage (%) in which the signal peak is positioned in area 3 (equal to or less than PDETL) within the time of a predetermined duration.

Figure 2:
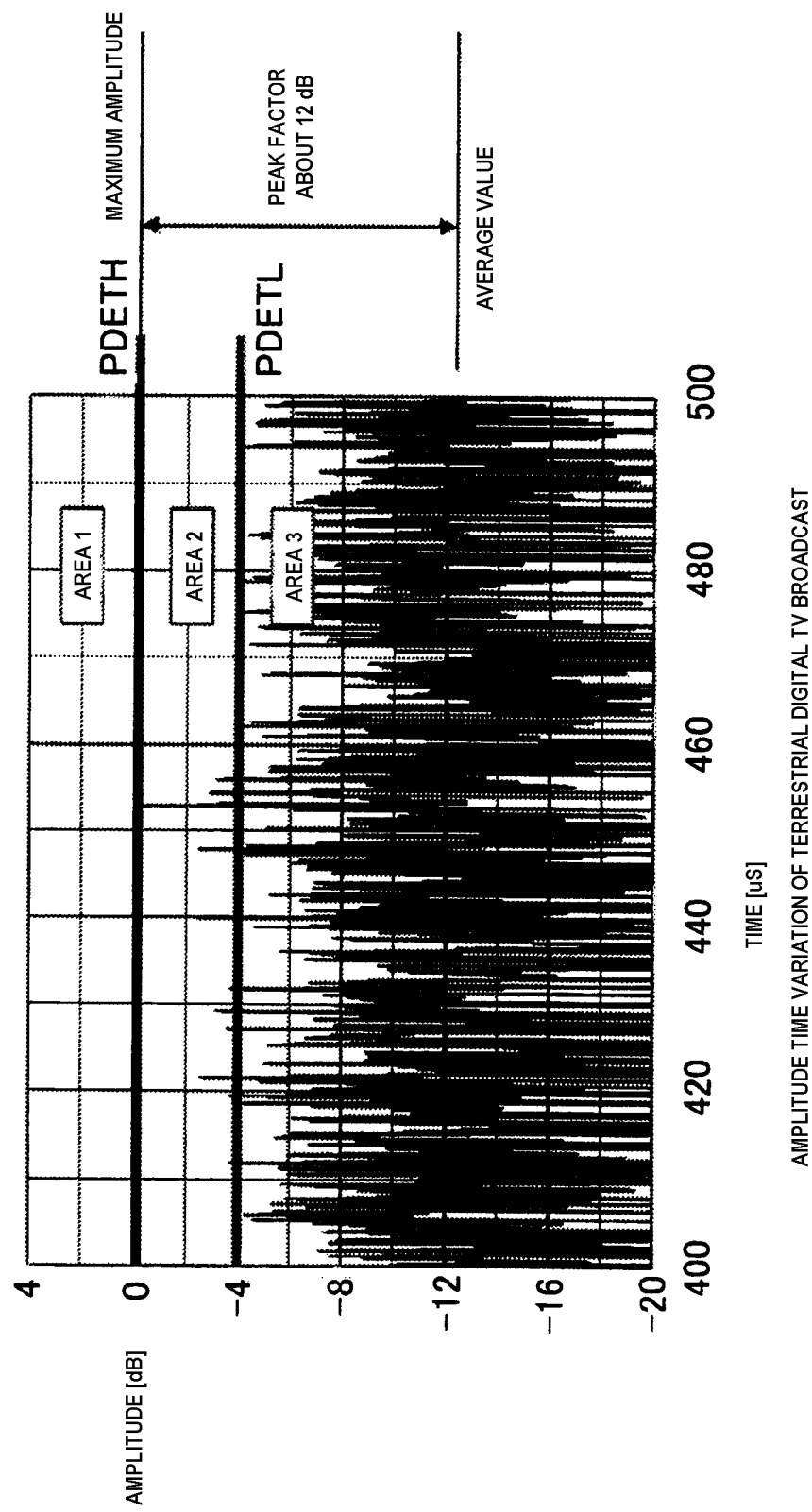
FIG. 2 is a characteristic diagram of receiver input signal (terrestrial digital TV broadcast wave) amplitude in Embodiment 1 of the invention.
Figure 3:
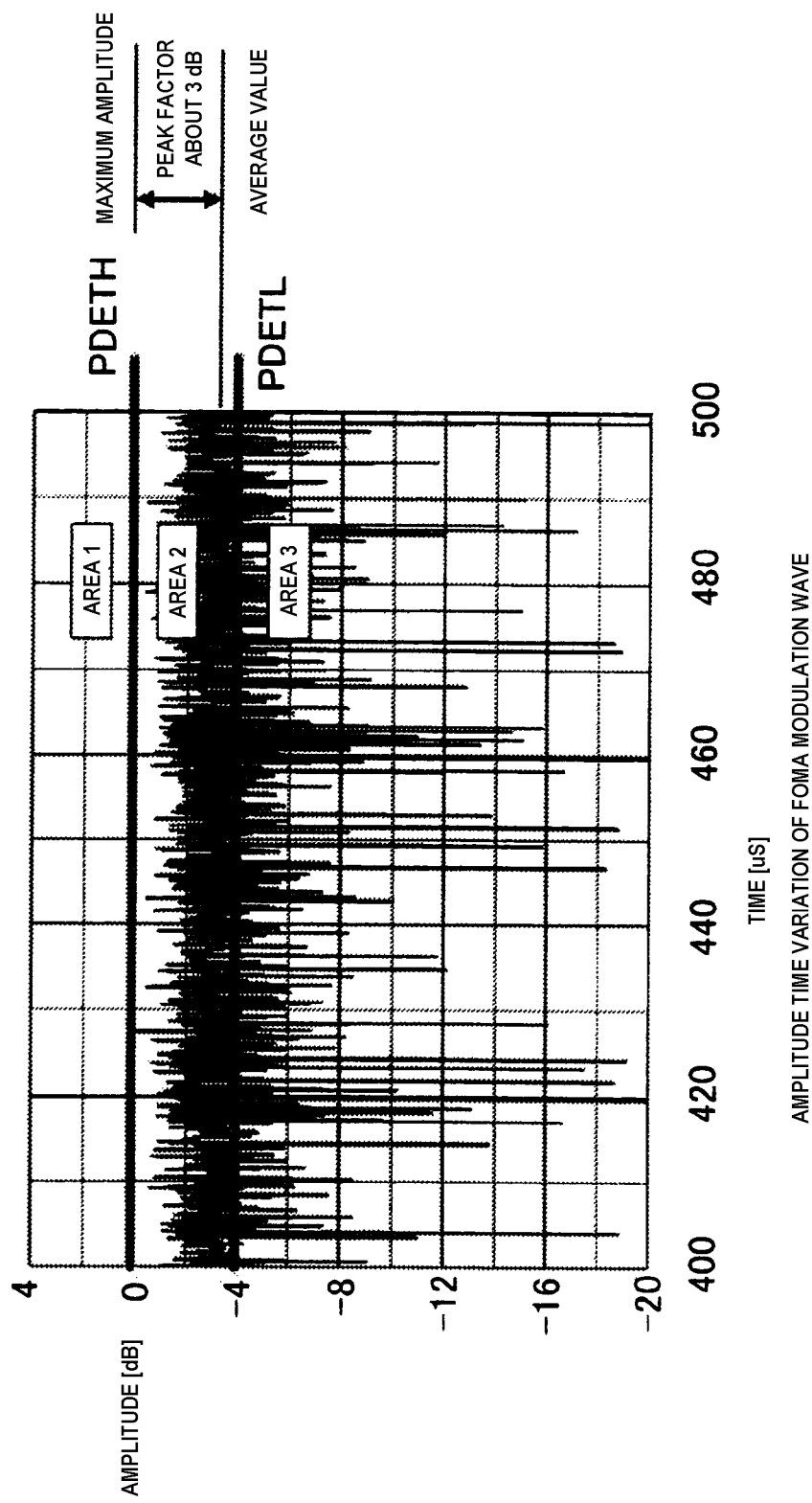
FIG. 3 is a characteristic diagram of receiver input signal (FOMA modulation wave) amplitude in Embodiment 1 of the invention.
Figure 9:
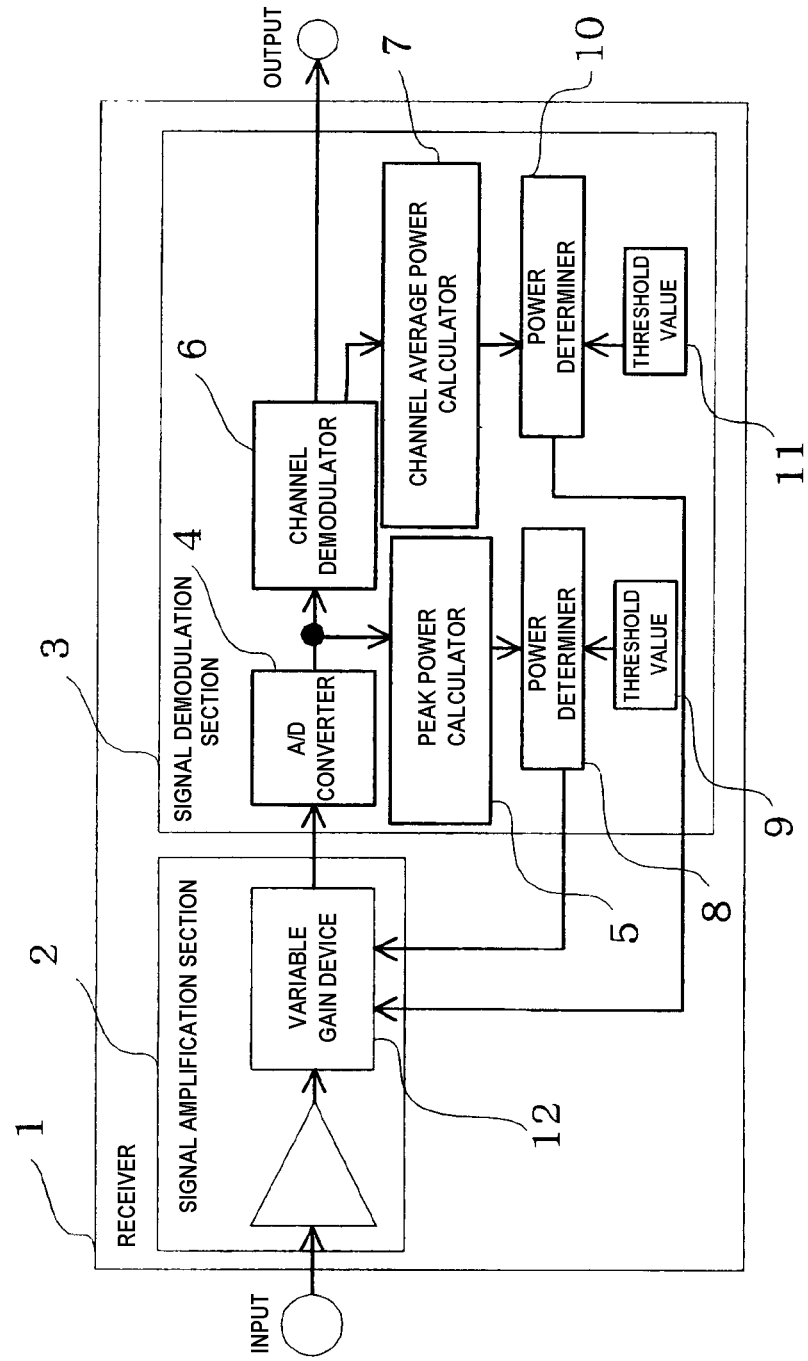
FIG. 9 shows the configuration of a receiver in a background art.

FIGS. 2 and 3 are amplitude characteristic diagrams of signals input to the receiver. FIG. 2 shows an example of time variation of amplitude value of terrestrial digital TV broadcast wave and FIG. 3 shows an example of time variation of amplitude value of FOMA (registered trademark) modulation wave of a mobile telephone.

In the terrestrial digital TV broadcast, OFDM (Orthogonal Frequency Division Multiplexing) is used as the modulation system, and the peak factor is about 12 dB. In contrast, in the FOMA modulation wave, in an uplink to a base station from a terminal, HPSK (Hybrid Phase Shift Keying) is used as the modulation system, and the peak factor is about 3 dB.

Thus, it is seen in FIGS. 2 and 3 that as the peak position of amplitude, the amplitude density in each of three areas 1, 2, and 3 separated by the threshold values PDETH and PDETL largely varies depending on the type of modulation wave.

Then, if attention is focused on the amplitude density difference caused by the type of modulation wave and the amplitude densities in areas 1 to 3 are compared, the terrestrial digital TV broadcast and the FOMA modulation wave can be distinguished. These two modulation waves are distinguished, whereby gain control start power can be changed in response to the type of modulation wave.

The level difference between the two threshold values PDETH and PDETL needs to be set in the vicinity of the peak factor of the signal with the smaller peak factor of the two modulation waves to distinguish (in FIG. 3, FOMA modulation wave) (for example, in the embodiment, the level difference is set to 4 dB).

In the related art example, after A/D conversion, the peak value and the average power are calculated separately by digital processing and thus there is no effects for input exceeding the input dynamic range of the A/D converter. In contrast, according to the embodiment, the amplitude density calculator 109 can use information of the amplitude density of the input signal determined in the power determiner 107, 108 to newly set the gain of the variable gain amplifier 102 to an optimum value. Therefore, according to the configuration, automatic gain control not depending on the input dynamic range of the A/D converter can be realized in the simpler configuration.

As described above, according to the receiver of the embodiment, the signal amplitude value (peak position of signal) output from the peak detector 104 is compared with the two threshold values and the amplitude density is calculated, whereby it is made possible to identify the type of input signal having a different peak factor and execute optimum gain control.

In Embodiment 1, of the modulation waves to distinguish, the modulation wave with the small peak factor is the modulation wave of Uplink (up link from terminal to base station) of FOMA (registered trademark) of a mobile telephone and the modulation wave with the large peak factor is the terrestrial digital TV broadcast wave by way of example, but the embodiment is not limited to the example.

The modulation wave with the small peak factor (roughly, 4 dB or less) may be mobile telephone PDC (Personal Digital Cellular), PHS (Personal Handyphone System), CDMAx1 (Code Division Multiple Access x1), GSM (Global System for Mobile communications)/EDGE (Enhanced Data rates for GSM Evolution), etc. The modulation wave with the large peak factor (roughly, 9 dB or more) may be WLAN (Wireless LAN) (802.11a/g), DownLink signal (down link from base station to terminal) of UMTS (Universal Mobile Telecommunications System), DVB (Digital Video Broadcasting project)-H, T-DMB (Digital Multimedia Broadcasting), etc.

Embodiment 2

In the embodiment, a specific method of performing gain control using information of the amplitude density described in Embodiment 1 will be described. That is, a method of determining the percentage in which the signal amplitude value (peak position of signal) output from the peak detector 104 (FIG. 1) is positioned in areas 1 to 3 separated by threshold values PDETH and PDETL (determination method 1) and feeding back into a variable gain amplifier 102 using the information will be described.

FIG. 4 is a flowchart to show a method of lowering the gain of a receiver if the input level to the receiver of the invention becomes strong. Here, the difference from Embodiment 1 will be mainly described.

Output after peak detection of an input signal of the receiver (signal amplitude value of each peak) is compared with the threshold values PDETH and PDETL during the stipulated time (for example, one frame of a terrestrial digital TV signal) and is classified into any of three areas each time and the number of times the output has been positioned in each area (percentage) is stored (step S11). Output after peak detection is PDout and area 1 of the three areas is defined as PDout>PDETH, area 2 is defined as PDETL<PDout≦PDETH, and area 3 is defined as PDout≦PDETL.

First, if (percentage of area 1) is not >0 (NO at step S12, namely, PDout does not come to area 1), the current value is maintained as the value of the gain in the variable gain amplifier 102 (step S15).

Next, if (percentage of area 1)>0 (YES at step S12) and (percentage of area 1) is not <(stipulated value 1) (NO at step S13, namely, PDout comes to area 1 exceeding stipulated value 1), the value of the gain in the variable gain amplifier 102 is set to a lower value than the current value (step S16).

If (percentage of area 1)>0 (YES at step S12) and (percentage of area 1)<(stipulated value 1) (YES at step S13) and further (percentage of area 2)≧(stipulated value 2) (YES at step S14), the current value is maintained as the value of the gain (step S15). On the other hand, if (percentage of area 2) is not ≧(stipulated value 2) (NO at step S14), the value of the gain is set to a lower value than the current value (step S16).

FIG. 5 shows the determination criteria of determination method 1 and shows the case where above-described stipulated value 1 is 3% and stipulated value 2 is 40%. FIG. 5 shows that if the percentage of area 1 is 3% or more, the gain of the receiver is lowered (Down), if the percentage of area 1 is less than 3% and the percentage of area 2 is 40% or more, the gain of the receiver is maintained (HOLD), and if the percentage of area 1 is less than 3% and the percentage of area 2 is less than 40%, the gain of the receiver is lowered (Down).

Thus, in the receiver of the embodiment, attention is focused on the percentage in which PDout comes to area 2, whereby the peak factor of the modulation wave is distinguished. If signals of two types to distinguish are an OFDM wave and an HPSK wave, it is desirable that the difference between PDETH and PDETL should be set to about 2 to 4 dB and that stipulated value 1 should be 3% and stipulated value 2 should be about 40% as shown in FIG. 5.

FIG. 6 shows the amplitude density analysis result of terrestrial digital TV broadcast wave (DTV signal) and FOMA modulation wave. From FIG. 6, it is seen that if the difference between PDETH and PDETL (detection range) is made too small, the signals cannot be distinguished and no effects are provided; if the difference is made too large, when the signal level is changed, malfunction occurs, as described below in detail:

When the detection range is 1 dB, if the strength of the signal is changed from 0 dB to 4 dB, gain control becomes Down (the gain is lowered) for the FOMA modulation wave and the DTV signal and no difference appears.

On the other hand, when the detection range is 2 dB to 4 dB, if the strength of the signal is changed from 0 dB to 4 dB, gain control becomes HOLD (the gain is maintained) for 0 dB and 1 dB of the FOMA modulation wave and gain control becomes Down for 2 dB to 4 dB. In contrast, gain control becomes all Down for 0 dB to 4 dB of DTV.

When the detection range is 5 dB, if the strength of the signal is changed from 0 dB to 4 dB, gain control becomes HOLD for 0 dB and 1 dB of the FOMA modulation wave and becomes Down for 2 dB to 4 dB, but gain control becomes HOLD in 3 dB of DTV and erroneous determination occurs.

As described above, according to the receiver of the embodiment, the peak factors of two modulation waves can be identified according to the density of PDETL<PDout≦PDETH (area 2), namely, the percentage in which PDout exists in area 2. The case where the input signal becomes strong is shown by way of example, but the embodiment can also be applied to the case where the input signal becomes weak and the gain is increased, needless to say.

Embodiment 3

FIG. 7 is a flowchart to show a method of lowering the gain of a receiver if the input level to the receiver in Embodiment 3 of the invention becomes strong. Although attention is focused on area 2 in Embodiment 2, a determination method (determination method 2) with attention focused on area 3 will be described. Here, the difference from Embodiment 2 will be mainly described.

First, if (percentage of area 1) is not >0 (NO at step S22), the current value is maintained as the gain in a variable gain amplifier 102 (step S25). Next, if (percentage of area 1)>0 (YES at step S22) and (percentage of area 1) is not <(stipulated value 3) (NO at step S23), the gain is decreased (step S26).

If (percentage of area 1)>0 (YES at step S22) and (percentage of area 1)<(stipulated value 3) (YES at step S23) and further (percentage of area 3) is not ≧(stipulated value 4) (NO at step S24), the current value is maintained as the value of the gain (step S25). On the other hand, if (percentage of area 3) is ≧(stipulated value 4) (YES at step S24), the value of the gain is set to a lower value than the current value (step S26).

FIG. 8 shows the determination criteria of determination method 2 and shows the case where above-described stipulated value 3 is 3% and stipulated value 4 is 60%. FIG. 5 shows that if the percentage of area 1 is 3% or more, the gain of the receiver is lowered (Down), if the percentage of area 1 is less than 3% and the percentage of area 3 is less than 60%, the gain of the receiver is maintained (HOLD), and if the percentage of area 1 is less than 3% and the percentage of area 3 is 60% or more, the gain of the receiver is lowered (Down).

Thus, in the receiver of the embodiment, attention is focused on the percentage in which PDout comes to area 3, whereby the peak factor of the modulation wave is distinguished. If signals of two types to distinguish are an OFDM wave and an HPSK wave, it is desirable that the difference between PDETH and PDETL should be set to about 2 to 4 dB and that threshold value 3 should be 3% and threshold value 4 should be about 60% as shown in FIG. 8. The input level dependency is the same as that in FIG. 6 and therefore will not be described again.

As described above, according to the receiver of the embodiment, the peak factors of two modulation waves can be identified according to the density of PDout≦PDETL (area 3), namely, the percentage in which PDout exists in area 3. The case where the input signal becomes strong is shown by way of example, but the embodiment can also be applied to the case where the input signal becomes weak and the gain is increased, needless to say.

Each of the function blocks used in the description of the embodiments is implemented typically as an LSI of an integrated circuit. The function blocks may be put individually into one chip or may be put into one chip so as to contain some or all.

Here, the integrated circuit is an LSI, but may be called an IC, a system LSI, a super LSI, or an ultra LSI depending on the difference in integration degree.

The technique of putting into an integrated circuit is not limited to an LSI and it may be implemented as a dedicated circuit or a general-purpose processor. An FPGA (Field Programmable Gate Array) that can be programmed after LSI is manufactured or a reconfigurable processor wherein connection and setting of circuit cells in LSI can be reconfigured may be used.

Further, if a technology of putting into an integrated circuit replacing LSI appears with the progress of the semiconductor technology or another deriving technology, the function blocks may be integrated using the technology, of course. There can be a possibility of applying a biotechnology, etc.

While the invention has been described in detail with reference to the specific embodiments, it will be obvious to those skilled in the art that various changes and modifications can be made without departing from the spirit and the scope of the invention.

This application is based on Japanese Patent Application (No. 2007-334609) filed on Dec. 26, 2007, which is incorporated herein by reference.

INDUSTRIAL APPLICABILITY

The invention can be used as a receiver and a gain control method used with a reception section of any of various high-frequency mobile communication apparatus.

The invention claimed is:

1. A receiver comprising:
   a variable gain amplifier for amplifying an input signal in a set gain;
   a peak detector for detecting instantaneous peak power PDout of output of the variable gain amplifier;
   a first power determiner for comparing the instantaneous peak power PDout with a threshold value PDETL;
   a second power determiner for comparing the instantaneous peak power PDout with a threshold value PDETH larger than the threshold value PDETL; and
   an amplitude density calculator for controlling a value of the gain of the variable gain amplifier based on amplitude density determined from output results of the first power determiner and the second power determiner, wherein the amplitude density indicates respective percentages that the instantaneous peak power PDout of the input signal correspond to respective power areas specified by at least the threshold values PDETH and PDETL.

2. The receiver as claimed in claim 1, wherein a level difference between the threshold values PDETH and PDETL is set to a value close to a peak factor value of a modulation wave with a small peak factor, of two types of modulation waves to be distinguished.

3. The receiver as claimed in claim 2, wherein the amplitude density calculator controls the gain of the variable gain amplifier based on which of a first power area larger than the threshold value PDETH, a second power area equal to or less than the threshold value PDETH and larger than the threshold value PDETL, and a third power area equal to or less than the threshold value PDETL the instantaneous peak power PDout corresponds to.

4. The receiver as claimed in claim 3, wherein the amplitude density calculator controls the gain of the variable gain amplifier based on a percentage in which the instantaneous peak power PDout corresponds to the second power area in a given time period.

5. The receiver as claimed in claim 3, wherein the amplitude density calculator controls the gain of the variable gain amplifier based on a percentage in which the instantaneous peak power PDout corresponds to the third power area in a given time period.

6. A wireless device installing the receiver as claimed in claim 1.

* * * * *